United States Patent
Taghizadeh et al.

(10) Patent No.: US 11,894,771 B2
(45) Date of Patent: Feb. 6, 2024

(54) CURRENT CONTROL CIRCUIT

(71) Applicant: General Electric Technology GmbH, Baden (CH)

(72) Inventors: Hassan Taghizadeh, Stafford (GB); Carl David Barker, Stafford (GB); Robert Stephen Whitehouse, Stafford (GB)

(73) Assignee: General Electric Technology GmbH, Baden (CH)

( * ) Notice: Subject to any disclaimer, the term of this patent is extended or adjusted under 35 U.S.C. 154(b) by 416 days.

(21) Appl. No.: 17/431,414

(22) PCT Filed: Jan. 28, 2020

(86) PCT No.: PCT/EP2020/051983
§ 371 (c)(1),
(2) Date: Aug. 16, 2021

(87) PCT Pub. No.: WO2020/164901
PCT Pub. Date: Aug. 20, 2020

(65) Prior Publication Data
US 2022/0123652 A1    Apr. 21, 2022

(30) Foreign Application Priority Data
Feb. 14, 2019   (EP) .................... 19157318

(51) Int. Cl.
*H02M 3/158* (2006.01)
*H02M 1/00* (2006.01)
(Continued)

(52) U.S. Cl.
CPC ......... *H02M 3/158* (2013.01); *H02M 1/0058* (2021.05); *H02M 1/0077* (2021.05); *H02M 1/32* (2013.01); *H02M 3/07* (2013.01)

(58) Field of Classification Search
CPC .. H02M 1/0077; H02M 1/008; H02M 1/0083; H02M 1/009; H02M 1/0058;
(Continued)

(56) References Cited

U.S. PATENT DOCUMENTS

| | | | | |
|---|---|---|---|---|
| 6,052,299 A | * | 4/2000 | Schieke | H02M 7/219 363/127 |
| 2011/0127925 A1 | * | 6/2011 | Huang | H05B 47/185 363/74 |
| 2015/0194906 A1 | * | 7/2015 | Yedinak | H02M 7/06 363/126 |

FOREIGN PATENT DOCUMENTS

| | | |
|---|---|---|
| EP | 2 905 885 A1 | 8/2015 |
| WO | 2017/171540 A1 | 10/2017 |

OTHER PUBLICATIONS

Search Report issued in PCT/EP2020/051983, dated Apr. 24, 2020, 2 pages.
(Continued)

*Primary Examiner* — Nguyen Tran
(74) *Attorney, Agent, or Firm* — Eversheds Sutherland (US) LLP

(57) ABSTRACT

There is provided a current control circuit (20) for connection between a first electrical network (42) and a converter, the current control circuit (20) comprising:
first and second input terminals (24,26) for connection to the first electrical network (42);
first and second output terminals (28,30) for respective connection to converter terminals (46,48) of the converter;
first and second switching limbs, the first switching limb interconnecting the first input and output terminals (24,28), the second switching limb interconnecting the second input and output terminals (26,30), each switching limb including a respective switching element (32,34,36,38);

(Continued)

a director limb (76) extending between the first and second output terminals (28,30), the director limb (76) including at least one current director element (84) and at least one first resistive element (86), the director limb (76) including an intermediate terminal (82);

a second resistive element (88), a first end of the second resistive element (88) operably connected to the intermediate terminal (82), a second end of the second resistive element (88) operably connectable to ground; and a controller (96) programmed to selectively control switching of each switching element (32,34,36,38) so as to, in use, regulate a flow of current from the first electrical network (42) to the converter.

14 Claims, 5 Drawing Sheets

(51) Int. Cl.
*H02M 1/32* (2007.01)
*H02M 3/07* (2006.01)

(58) Field of Classification Search
CPC ...... H02M 1/0067; H02M 1/007; H02M 1/32; H02M 1/322; H02M 1/34; H02M 3/158; H02M 3/1584; H02M 3/1586; H02M 3/07; H02M 3/071; H02M 3/072; H02M 3/077

See application file for complete search history.

(56) References Cited

OTHER PUBLICATIONS

Sasan Zabihi et al., "A new family of marx generators based on commutation circuits," IEEE Transactions On Dielectrics and Electrical Insulation, IEEE Service Center, Piscataway, NJ, US vol. 18, No. 4, Aug. 1, 2011 (Aug. 1, 2011), pp. 1181-1188, XP01137458, ISSN: 1070-9878, Doi: 10.1109/TDEI.2011.5976113 *figure 3*.

Veilleux Etienne et al., "Marx dc-dc converter for high-power applica," IET Power Electro, IET UK, vol. 6, No. 9, Nov. 1, 2013 (Nov. 1, 2013), pp. 1733-1741, XP006047490, ISSN: 1755-4535, DOI: 10.1049/IET-PEL.2013.0025 *the whole document*.

* cited by examiner

CURRENT CONTROL CIRCUIT

CROSS-REFERENCE TO RELATED APPLICATIONS

This application is a U.S. National Stage Application under 35 U.S.C. 371 and claims the priority benefit of International Application No. PCT/EP2020/051983, filed Jan. 28, 2020, which claims priority to European Application No. 19157318.7, filed Feb. 14, 2019, both of which are incorporated herein by reference.

This invention relates to a current control circuit for connection between an electrical network and a converter, and to an assembly comprising a converter and a current control circuit, preferably for use in electrical power conversion, transmission and distribution.

Power conversion is utilized in power transmission systems where it is necessary to interconnect different electrical networks. In any such power transmission system, converters are required at the interface between the different electrical networks to effect the required conversion.

According to a first aspect of the invention, there is provided a current control circuit for connection between a first electrical network and a converter, the converter including at least one energy storage device the current control circuit comprising:
  first and second input terminals for connection to the first electrical network;
  first and second output terminals for respective connection to converter terminals of the converter;
  first and second switching limbs, the first switching limb interconnecting the first input and output terminals, the second switching limb interconnecting the second input and output terminals, each switching limb including a respective switching element;
  a director limb extending between the first and second output terminals, the director limb including at least one current director element and at least one first resistive element, the director limb including an intermediate terminal;
  a second resistive element, a first end of the second resistive element operably connected to the intermediate terminal, a second end of the second resistive element operably connectable to ground; and
  a controller programmed to selectively control switching of each switching element so as to, in use, regulate a flow of current from the first electrical network to the converter.

The configuration of the current control circuit of the invention enables the current control circuit to regulate a flow of current from the first electrical network to the converter in order to provide the converter with protection from potentially damaging currents. Non-limiting examples of such regulation of the flow of current from the first electrical network to the converter are described as follows.

In a first example, the controller may be programmed to selectively control switching of each switching element during a start-up of the converter so as to, in use, regulate the flow of current from the first electrical network to the converter by directing the current through one or more of the resistive elements. This provides a reliable means of limiting inrush currents during the start-up of the converter, thus enabling a soft-start of the converter.

In a second example, the controller may be programmed to selectively control switching of each switching element so as to, in use, limit or block a flow of current from the first electrical network to the converter. This may be carried out in response to an occurrence of a fault in the converter and/or in the first electrical network.

In a third example, the controller may be programmed to selectively control switching of each switching element so as to, in use, disconnect the converter from the first electrical network in response to an occurrence of a fault in the converter and/or in the first electrical network.

The configuration of the current control circuit of the invention therefore enables the current control circuit to be provided with soft-start, fault current blocking and fault current limiting capabilities, which beneficially reduces the risk of damage to the converter as a result of large inrush or fault currents. This not only increases the reliability of the converter, but also removes the need for a more complex and costlier setup based on separate hardware, each of which is configured to have one of soft-start, fault current blocking and fault current limiting capabilities.

Furthermore, the arrangement of the resistive elements in the current control circuit of the invention enables the current control circuit to carry out a current limiting function in respect of a myriad of situations, such as a start-up of the converter, a fault in the converter, and a fault in the first electrical network.

The arrangement of the director limb in the current control circuit of the invention provides a route for selectively dissipating energy stored in the inductance of the converter in the event of a fault. In addition, the provision of the or each current flow control element in the director limb enables configuration of the director limb so as to block current from flowing in the director limb during normal operation of the converter.

The director limb may vary in configuration.

In embodiments of the invention, the director limb may include first and second director limb portions, the first and second director limb portions separated by the intermediate terminal, the first director limb portion extending between the first output terminal and the intermediate terminal, the second director limb portion extending between the second output terminal and the intermediate terminal, each director limb portion including a respective current director element and a respective first resistive element.

In further embodiments of the invention, the or each current director element may be configured to permit current to flow in the director limb in one direction and block current from flowing in the director limb in the opposite direction. This provides a reliable means of blocking current from flowing in the director limb during normal operation of the converter.

In still further embodiments of the invention, the current control circuit may include:
  a third switching limb, a first end of the third switching limb operably connected to the first input terminal, a second end of the third switching limb for connection to the first electrical network; and
  a fourth switching limb, a first end of the fourth switching limb operably connected to the second input terminal, a second end of the fourth switching limb for connection to the first electrical network.

The provision of the third and fourth switching limbs in the current control circuit of the invention enables selective connection and disconnection of the first electrical network from the current control circuit and the converter.

According to a second aspect of the invention, there is provided an assembly comprising:
  a converter including first converter terminals; and
  a current control circuit according to the first aspect of the invention or any one of its embodiments as described hereinabove, the first and second output terminals respectively connected to the converter terminals.

The assembly may include at least one first filter energy storage device connected between the first input terminal and the first end of the second resistive element, and/or at least one first filter energy storage device connected between the second input terminal and the first end of the second resistive element.

Switching of the first switching limb and/or the second switching limb may be controlled to block a flow of a fault current from the or each first filter energy storage device into the converter in the event of a fault in the converter. Furthermore, the provision of the second resistive element in the current control circuit of the invention provides a way of dissipating energy stored in the or each first filter energy storage device in the event of a fault.

In a preferred embodiment of the invention, the converter may include at least one energy storage device. The or each energy storage device may be any device that is capable of storing and releasing energy to selectively provide a voltage, e.g. a capacitor, fuel cell or battery.

In embodiments of the invention employing the use of a converter including at least one energy storage device, the converter may include at least one module, the or each module including at least one switching element and at least one energy storage device, the or each switching element and the or each energy storage device in the or each module arranged to be combinable to selectively provide a voltage source.

In further embodiments of the invention employing the use of a converter including at least one energy storage device, the converter may include a plurality of energy storage devices and a plurality of switching elements arranged to define a switched energy storage device converter.

The current control circuit of the invention advantageously enables charging of the energy storage device(s) while protecting the converter through regulation of the current flowing from the first electrical network to the converter.

The controller may be programmed to selectively control switching of each switching element during a start-up of the converter so as to, in use, regulate charging of the or each energy storage device by regulating the flow of current from the first electrical network to the converter. This beneficially prevents the energy storage device(s) from being exposed to large inrush currents during the start-up of the converter.

The charging of the energy storage device(s) may be carried out in a variety of ways. For example, the controller may be programmed to selectively control switching of each switching element during a start-up of the converter so as to, in use, connect the first electrical network to the converter via the first switching limb to charge the energy storage device, or at least one of the energy storage devices, of the converter, and then connect the first electrical network to the converter via the second switching limb to charge the energy storage device, or at least one of the energy storage devices, of the converter.

Furthermore, when the converter includes second converter terminals for connection to a second electrical network and the assembly includes at least one second filter energy storage device connected to the second converter terminals, the controller may be programmed to selectively control switching of each switching element during a start-up of the converter so as to, in use, use energy stored in the energy storage device, or at least one of the energy storage devices, to charge the or each second filter energy storage device.

At least one switching element may include at least one self-commutated switching device. The or each self-commutated switching device may be an insulated gate bipolar transistor, a gate turn-off thyristor, a field effect transistor, an injection-enhanced gate transistor, an integrated gate commutated thyristor or any other self-commutated switching device. The number of switching devices in each switching element may vary depending on the required voltage and current ratings of that switching element.

The switching element of each of the third and fourth switching limbs may be a disconnector or a circuit interruption device, such as a circuit breaker.

At least one switching element may further include a passive current check element that is connected in anti-parallel with the or each switching device. At least one current director element may include a passive current check element. The or each passive current check element may include at least one passive current check device. The or each passive current check device may be any device that is capable of limiting current flow in only one direction, e.g. a diode. The number of passive current check devices in each passive current check element may vary depending on the required voltage and current ratings of that passive current check element.

According to a third aspect of the invention, there is provided a method of operating a current control circuit connected between a first electrical network and a converter, the current control circuit comprising:

first and second input terminals for connection to the first electrical network;

first and second output terminals for respective connection to converter terminals of the converter;

first and second switching limbs, the first switching limb interconnecting the first input and output terminals, the second switching limb interconnecting the second input and output terminals, each switching limb including a respective switching element;

a director limb extending between the first and second output terminals, the director limb including at least one current director element and at least one first resistive element, the director limb including an intermediate terminal; and a second resistive element, a first end of the second resistive element operably connected to the intermediate terminal, a second end of the second resistive element operably connectable to ground, wherein the method comprises the step of selectively controlling switching of each switching element so as to regulate a flow of current from the first electrical network to the converter.

The features and advantages of the current control circuit of the first aspect of the invention and its embodiments apply mutatis mutandis to the method of the third aspect of the invention and its embodiments.

The method of the third aspect of the invention may include the step of selectively controlling switching of each switching element during a start-up of the converter so as to, in use, regulate the flow of current from the first electrical network to the converter by directing the current through one or more of the resistive elements.

The method of the third aspect of the invention may include the step of selectively controlling switching of each switching element so as to, in use, limit or block a flow of current from the first electrical network to the converter.

The method of the third aspect of the invention may include the step of selectively controlling switching of each switching element so as to, in use, disconnect the converter from the first electrical network in response to an occurrence of a fault in the converter and/or in the first electrical network.

In the method of the third aspect of the invention, the director limb may include first and second director limb portions, the first and second director limb portions separated by the intermediate terminal, the first director limb portion extending between the first output terminal and the intermediate terminal, the second director limb portion extending between the second output terminal and the intermediate terminal, each director limb portion including a respective current director element and a respective first resistive element.

In the method of the third aspect of the invention, the or each current director element may be configured to permit current to flow in the director limb in one direction and block current from flowing in the director limb in the opposite direction.

In the method of the third aspect of the invention, the current control circuit may include:
- a third switching limb, a first end of the third switching limb operably connected to the first input terminal, a second end of the third switching limb for connection to the first electrical network; and
- a fourth switching limb, a first end of the fourth switching limb operably connected to the second input terminal, a second end of the fourth switching limb for connection to the first electrical network.

According to a fourth aspect of the invention, there is provided a method of operating an assembly comprising:
- a converter including first converter terminals; and
- a current control circuit as described in the method according to the third aspect of the invention or any one of its embodiments as described hereinabove, the first and second output terminals respectively connected to the first converter terminals,
- wherein the method comprises the step of operating the current control circuit in accordance with the method according to the third aspect of the invention or any one of its embodiments as described hereinabove.

The features and advantages of the assembly of the second aspect of the invention and its embodiments apply mutatis mutandis to the method of the fourth aspect of the invention and its embodiments.

In the method of the fourth aspect of the invention, the assembly may include at least one first filter energy storage device connected between the first input terminal and the first end of the second resistive element, and/or at least one first filter energy storage device connected between the second input terminal and the first end of the second resistive element.

In the method of the fourth aspect of the invention, the converter may include at least one energy storage device.

In the method of the fourth aspect of the invention, the converter may include at least one module, the or each module including at least one switching element and at least one energy storage device, the or each switching element and the or each energy storage device in the or each module arranged to be combinable to selectively provide a voltage source, and/or wherein the converter may include a plurality of energy storage devices and a plurality of switching elements arranged to define a switched energy storage device converter.

The method of the fourth aspect of the invention may include the step of selectively controlling switching of each switching element during a start-up of the converter so as to, in use, regulate charging of the or each energy storage device by regulating the flow of current from the first electrical network to the converter.

The method of the fourth aspect of the invention may include the step of selectively controlling switching of each switching element during a start-up of the converter so as to, in use, connect the first electrical network to the converter via the first switching limb to charge the energy storage device, or at least one of the energy storage devices, of the converter, and then connect the first electrical network to the converter via the second switching limb to charge the energy storage device, or at least one of the energy storage devices, of the converter.

In the method of the fourth aspect of the invention, the converter may include second converter terminals for connection to a second electrical network, the assembly including at least one second filter energy storage device connected to the second converter terminals, wherein the method may include the step of selectively controlling switching of each switching element during a start-up of the converter so as to, in use, use energy stored in the energy storage device, or at least one of the energy storage devices, to charge the or each second filter energy storage device.

It will be appreciated that the use of the terms "first" and "second", and the like, in this patent specification is merely intended to help distinguish between similar features (e.g. the first and second electrical networks, the first and second input terminals, the first and second output terminals, and so on), and is not intended to indicate the relative importance of one feature over another feature, unless otherwise specified.

It will also be appreciated that the reference to "a switching element" encompasses a single switching element or multiple switching elements, and the reference to "a second resistive element" encompasses a single second resistive element or multiple second resistive elements.

A preferred embodiment of the invention will now be described, by way of a non-limiting example, with reference to the accompanying drawings in which.

Figure 1:
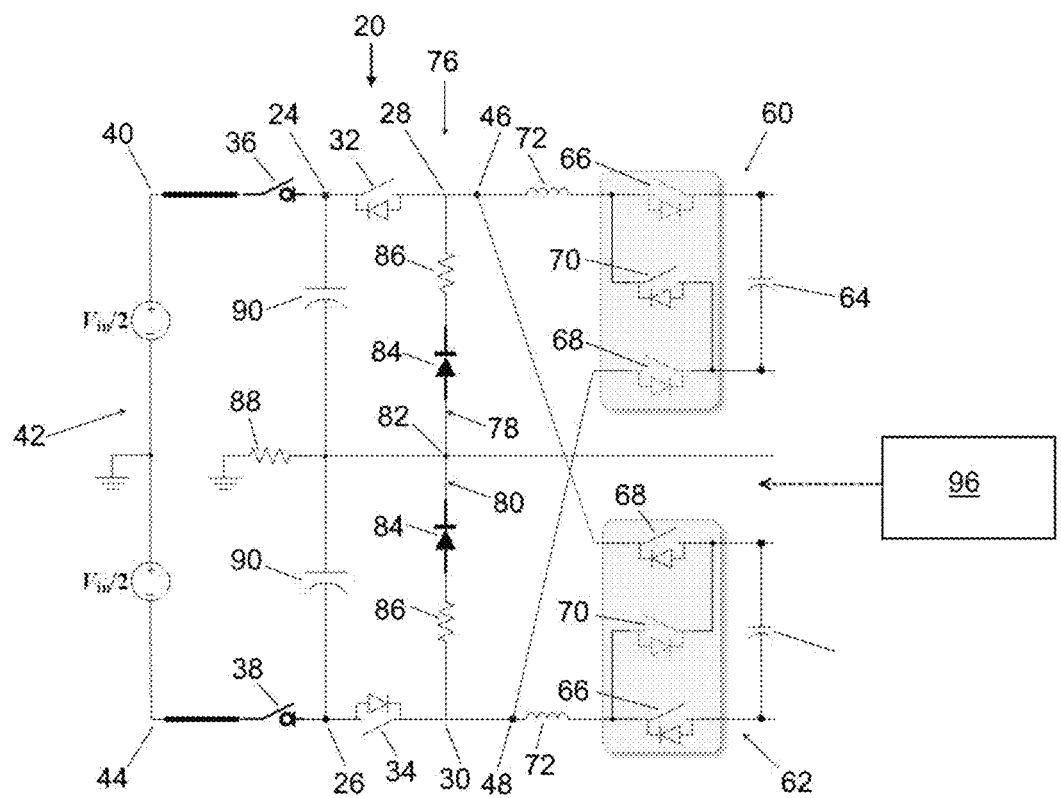
FIGS. 1 and 2 show an assembly according to an embodiment of the invention.
Figure 2:
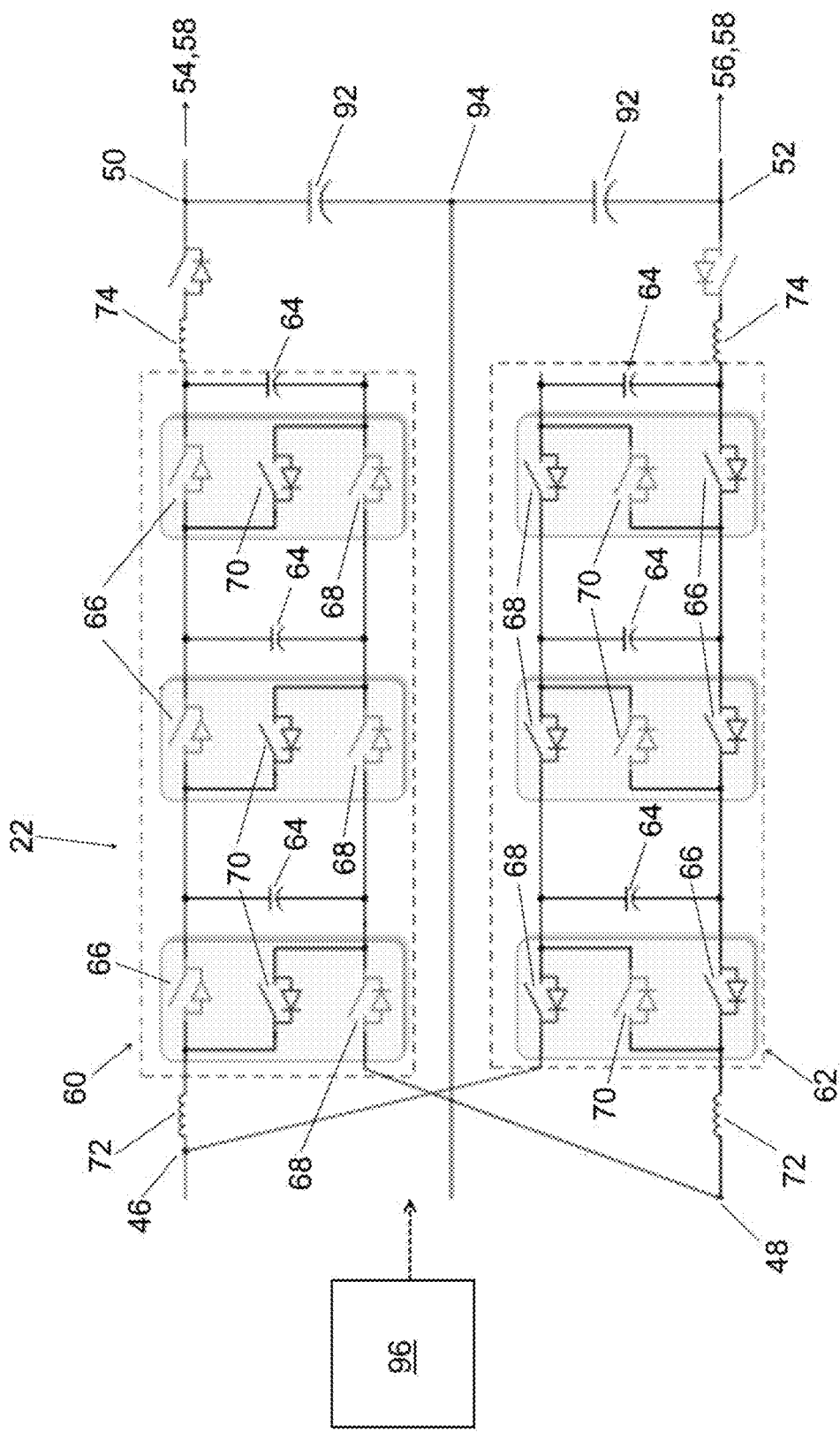

An assembly according to an embodiment of the invention is shown in FIGS. 1 and 2, and comprises a current control circuit 20 and a switched capacitor DC-DC converter 22.

The current control circuit 20 comprises first and second input terminals 24,28, and first and second output terminals 26,30. The current control circuit further comprises first, second, third and fourth switching limbs. Each switching limb includes a respective switching element 32,34,36,38.

The first switching limb interconnects the first input and output terminals 24,26. The second switching limb interconnects the second input and output terminals 28,30. A first end of the third switching limb is connected to the first input terminal 24. A second end of the third switching limb is connected, in use, to a positive voltage 40 of a first bi-pole DC network 42. A first end of the fourth switching limb is connected to the second input terminal 26. A second end of the fourth switching limb is connected, in use, to a negative voltage 44 of the first bi-pole DC network 42.

In the embodiment shown, each switching element 36,38 of the third and fourth switching limbs is in the form of a disconnector. In other embodiments of the invention, it is envisaged that each switching element 36,38 of the third and fourth switching limbs may be configured as an AC or DC circuit breaker.

The converter 22 includes first converter terminals 46,48 and second converter terminals 50,52.

The first and second output terminals 26,30 of the current control circuit 20 are respectively connected to the first converter terminals 46,48 of the switched capacitor DC-DC converter 22. As a result, the first converter terminal 46 connected to the first output terminal 26 forms a positive first converter terminal 46, and the first converter terminal 46 connected to the second output terminal 30 forms a negative first converter terminal 48.

The second converter terminals 50,52 are respectively connected, in use, to positive and negative voltages 54,56 of a second bi-pole DC network 58. As a result, the second converter terminal 50 connected to the positive voltage 54 of the second bi-pole DC network 58 forms a positive second converter terminal 50, and the second converter terminal 52 connected to the negative voltage 56 of the second bi-pole DC network 58 forms a negative second converter terminal 52.

The switched capacitor DC-DC converter 22 includes first and second switched capacitor DC-DC converter modules 60,62 (referred to hereon as first and second modules 60,62 respectively for conciseness). The input of the first module 60 is connected between the positive and negative first converter terminals 46,48, while the output of the first module 60 is connected to the positive second converter terminal 50. The input of the second module 62 is connected between the positive and negative first converter terminals 46,48, while the output of the second module 60 is connected to the negative second converter terminal 52.

Each of the first and second modules 60,62 includes a plurality of capacitors 64 and a plurality of switching elements 66,68,70 arranged in a series-parallel topology. More particularly, in each of the first and second modules 60,62, the plurality of switching elements 66,68,70 are arranged so that:
- in each module 60,62, turning on switching elements 66,68 and turning off switching elements 70 results in the capacitors 64 being connected in parallel relative to the positive and negative first converter terminals 46,48;
- in the first module 60, turning off switching elements 66,68 and turning on switching elements 70 results in the capacitors 64 being connected in series between the positive first and second converter terminals 46,50; and
- in the second module 62, turning off switching elements 66,68 and turning on switching elements 70 results in the capacitors 64 being connected in series between the negative first and second converter terminals 48,52.

In use, the first and second modules 60,62 are respectively operated to generate positive and negative voltages at the corresponding second converter terminals 50,52, and are operated in anti-phase to reduce voltage ripple in the first and second converter terminals 46,48,50,52.

A resonant inductor 72 is connected between the input of the first module 60 and the positive first converter terminal 46, while another resonant inductor 72 is connected between the input of the second module 62 and the negative first converter terminal 48. In addition, a series connection of a resonant inductor 74 and a switching element is connected between the output of the first module 60 and the positive second converter terminal 50, while another series connection of a resonant inductor 74 and a switching element is connected between the output of the second module 62 and the negative second converter terminal 52. This enables the switched capacitor DC-DC converter 22 to operate in resonant mode and achieve soft switching, i.e. switching at zero current.

Resonant inductors may be distributed within each of the first and second modules 60,62, which helps to limit fault current in the event of a fault internal to the converter 22 and also limit a spike in current within the module 60,62 that may occur during switching, A director limb 76 is connected between the first and second output terminals 26,30. The director limb 76 includes first and second director limb portions 78,80 that are separated by a first intermediate terminal 82. The first director limb portion 78 is connected between the first output terminal 26 and the first intermediate terminal 82. The second director limb portion 80 is connected between the second output terminal 30 and the first intermediate terminal 82.

Each director limb portion 78,80 includes a respective current director element 84 in the form of a diode 84, and a respective first resistor 86. In each director limb portion 78,80, the diode 84 and first resistor 86 are connected in series. The diode 84 of the first director limb portion 78 is arranged so that current can only flow in the first director limb portion 78 from the first intermediate terminal 82 to the first output terminal 26. The diode 84 of the second director limb portion 80 is arranged so that current can only flow in the second director limb portion 80 from the second output terminal 30 to the first intermediate terminal 82.

The current control circuit 20 further includes a second resistor 88. A first end of the second resistor 88 is connected to the first intermediate terminal 82. A second end of the second resistor 88 is connected, in use, to ground.

A first DC link capacitor 90 is connected between the first input terminal 24 and the first end of the second resistor 88, and another first DC link capacitor 90 is connected between the second input terminal 28 and the first end of the second resistor 88. Each first DC link capacitor 90 is also referred to hereon as an input filter capacitor 90. A pair of second DC link capacitors 92 are connected between the second converter terminals 50,52, with the pair of second DC link capacitors 92 being separated by a second intermediate terminal 94. Each second DC link capacitor 92 is also referred to hereon as an output filter capacitor 92. In the embodiment shown, the first and second intermediate terminals 82,94 are preferably directly connected to each other.

The assembly includes a controller 96 programmed to selectively control switching of the switching elements 32,34,36,38,66,68,70. It is envisaged that, in other embodiments of the invention, the assembly may include first and second controllers, where the first controller is programmed to selectively control switching of the switching elements 32,34,36,38 of the current control circuit 20, and the second controller is programmed to selectively control switching of the switching elements 66,68,70 of the converter 22.

Operation of the current control circuit 20 is described as follows, with reference to FIGS. 3 to 6.

The above embodiment of the invention is configured to have bidirectional power flow capability. However, for the sake of simplicity, only a step-up operation of the converter 22, where power flows from the first bi-pole DC network 42 to the second bi-pole DC network 58, is described here.

Figure 3:
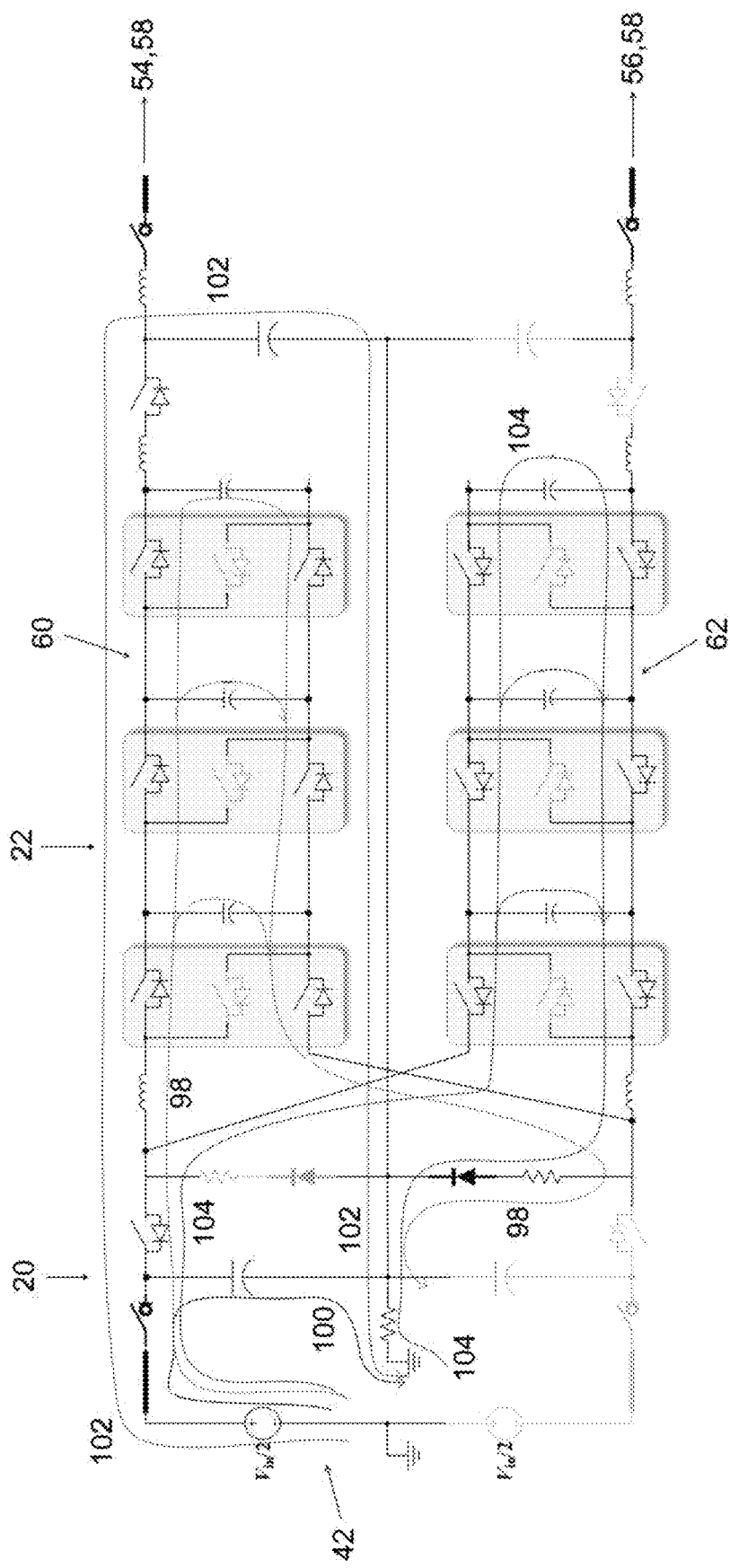
FIG. 3 shows a start-up of a converter of the assembly of FIG. 1.

FIG. 3 shows a start-up procedure of the switched capacitor DC-DC converter 22 when all of the capacitors 64,90,92 are fully discharged and all of the switching elements 32,34,36,38,66,68,70 are turned off. The soft-start procedure is as follow.

1) Turn on switching elements 66,68 of the first and second modules 60,62, and turn on the switching element 32 of the first switching limb. This forms a connection path 98 between all of the modules' capacitors 64 as well as connection paths 100, 102 through the input and output filter capacitors 90,92 connected to the positive first and second converter terminals 46,50. In this regard a connection path 104 through the second module's capacitors 64 is formed through the diode 84 and first resistor 86 of the second director limb portion 80.
2) Close the switching element 36 of the third switching limb. This charges the input and output filter capacitors 90,92 connected to the positive first and second converter terminals 46,50 as well as the modules' capacitors 64 via the second resistor 88 to $0.5V_{in}$.
3) Wait until a steady-state condition is reached in which the current flowing through the capacitors 64 is zero.
4) Turn off the switching element 36 of the third switching limb.
5) Turn on the switching elements 34,38 of the second and fourth switching limbs. This results in the voltage of the modules' capacitors 64 increasing to $V_{in}$, and the input and output filter capacitors 90,92 connected to the negative first and second converter terminals 48,52 charging to $0.5V_{in}$.
6) Turn off all of the switching elements 32,34,36,38,66,68,70 (optionally switching elements 36,38 of the third and fourth switching limbs may be closed at this stage).
7) Turn on the switching elements 70 of the modules 60,62. This charges the output filter capacitors 90,92 to N times the input voltage $V_{in}$ via the series connection of the modules' capacitors 64 and the first resistors 86, and the freewheeling diodes 84 of the director limb 76 where N is the number of capacitors 64 in each module 60,62. In the embodiment shown, each output filter capacitor 92 is charged up to about $3V_{in}$.
8) Turn off all switching elements 32,34,36,38,66,68,70.
9) Turn on the switching elements 32,34,36,38 of the switching limbs and the switching elements 66,68 of the modules 60,62.
10) Repeat stages 5-8 until a steady-state condition is reached in which each capacitor 64 of the modules 60,62 is at $V_{in}$ and the output filter capacitors 92 is at $N \times V_{in}$.

In the above soft-start procedure, the flow of current from the first bi-pole DC network 42 to the converter 22 is directed through one or more of the resistors 86,88. This provides a reliable means of limiting inrush currents during the start-up of the converter 22, thus enabling a soft-start of the converter 22.

The configuration of the current control circuit 20 enables the operation of the current control circuit 20 to block or limit fault current that could result in damage to the converter components.

In normal operation of the switched capacitor DC-DC converter 22, switching elements 32,34 of the first and second switching limbs are closed. In the event of a fault internal to the switched capacitor DC-DC converter 22, these switching elements 32,34 are turned off so that a fault current is blocked from flowing from the first bi-pole DC network 42 and the first DC link capacitors 90 to the switched capacitor DC-DC converter 22.

In the event of a fault in the first bi-pole DC network 42, switching elements 36,38 of the third and fourth switching limbs may be used to disconnect the switched capacitor DC-DC converter 22 from the first bi-pole DC network 42, so that a fault current is blocked from flowing from the first bi-pole DC network 42 to the switched capacitor DC-DC converter 22.

Figure 4:
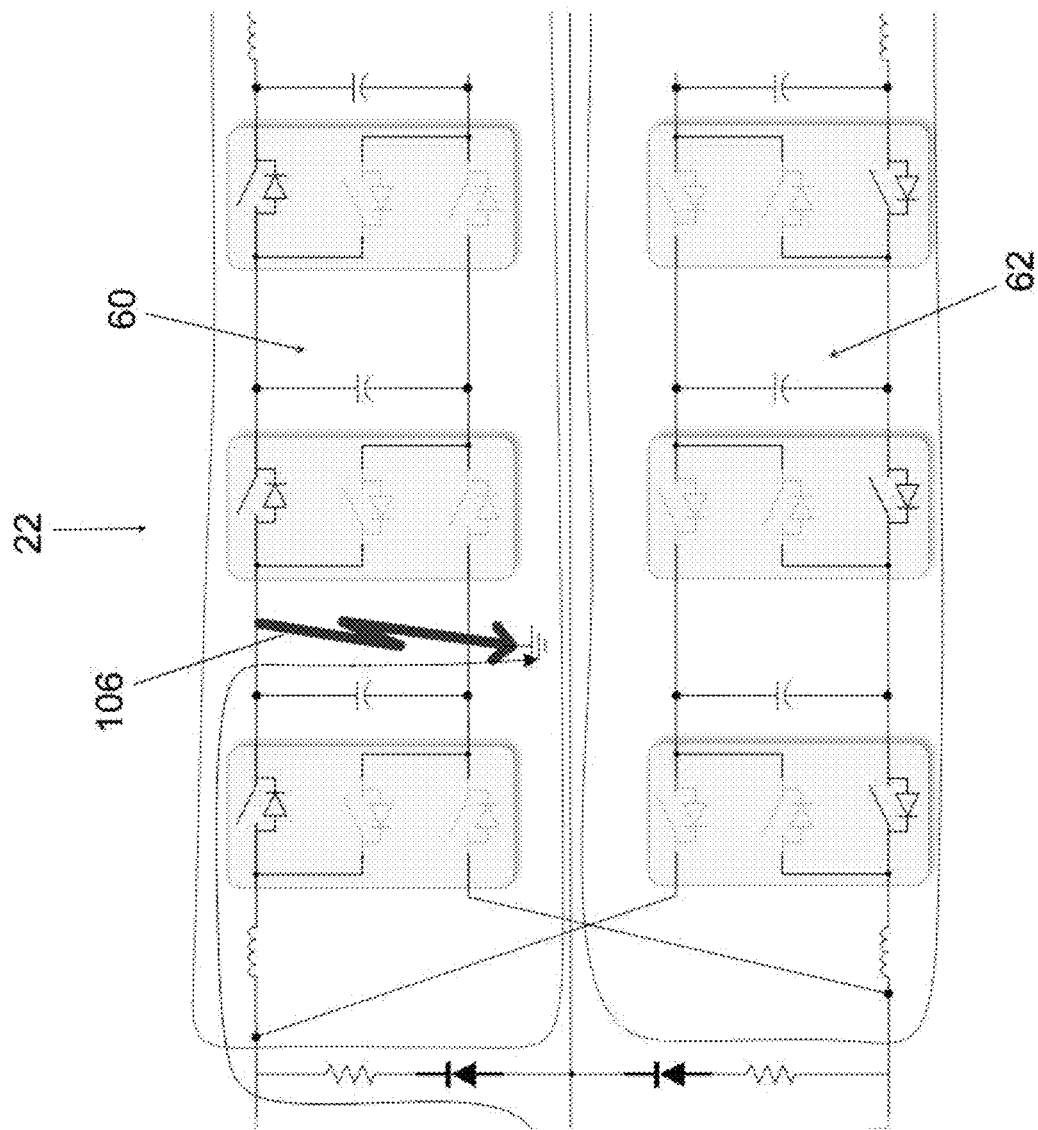
FIG. 4 shows a fault response of the assembly of FIG. 1.

FIG. 4 shows a fault response of the assembly in which specific fault current paths are formed to limit the current.

When all of the switching elements 32,34,36,38,66,68,70 are turned off in response to an occurrence of a fault, energy stored in the resonant inductors 72,74 are diverted through the free-wheeling diodes of the modules 60,62 and the diodes 84 of the director limb 76 so as to be dissipated in the first resistors 86 of the director limb 76.

If the fault internal to the converter 22 is between a terminal and neutral or between terminals, the energy stored in the resonant inductors 72,74 are dissipated in the first resistors 86. If the fault internal to the converter 22 is between a terminal and ground, the energy stored in the resonant inductors 72,74 are dissipated in the first and second resistors 86,88.

If the fault is between the first bi-pole DC network 42 and ground, the fault current arising from the energy stored in the first DC link capacitors 90 is dissipated in the second resistor 88.

The ability to direct a current through one or more of the resistors 86,88 in response to a converter or network fault limits any fault current arising from the converter or network fault.

Figure 5:
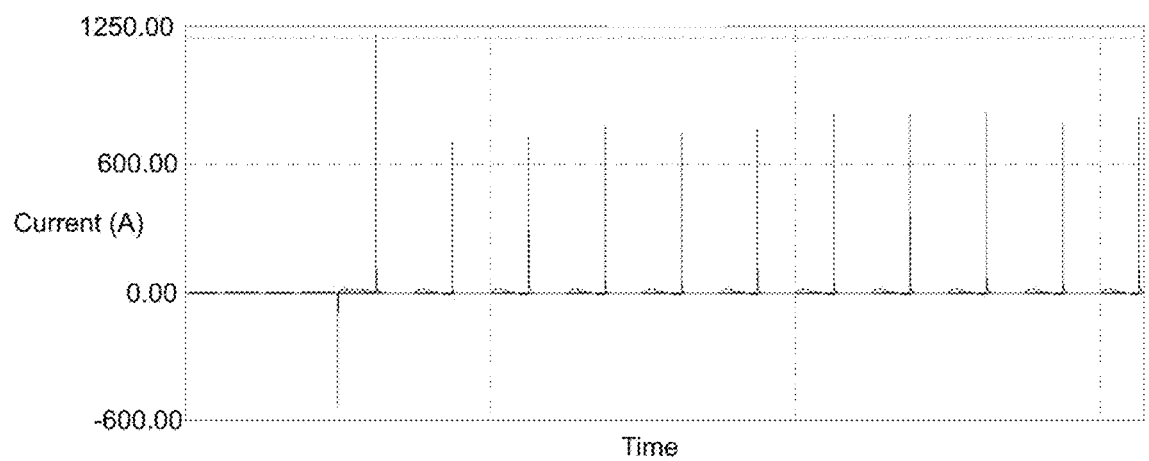
FIG. 5 shows results of a simulation of the assembly of FIG. 1 when the assembly omits the current control circuit.
Figure 6:
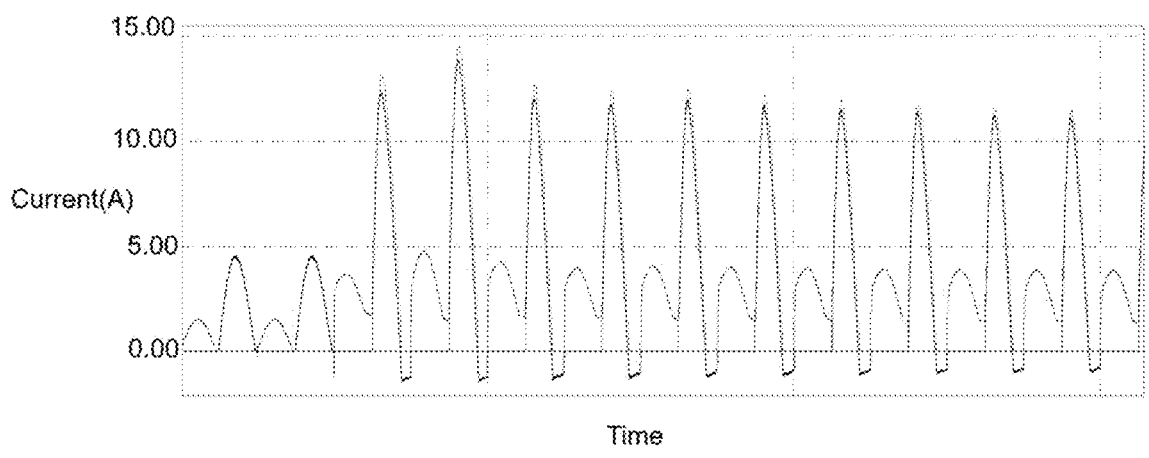
FIG. 6 shows results of a simulation of the assembly of FIG. 1 when the assembly includes the current control circuit.

FIGS. 5 and 6 show results of a simulation for an internal converter fault. A terminal to ground fault 106 is applied within the first module 60 as shown in FIG. 4. FIG. 5 shows the fault current waveforms through the switching elements 66,68,70 of the first module 60 when the assembly omits the current control circuit 20, while FIG. 6 shows the fault current waveforms through the switching elements 66,68,70 of the first module 60 when the assembly includes the current control circuit 20. It can be seen from FIGS. 5 and 6 that the fault current waveforms through the switching elements 66,68,70 of the first module 60 are significantly lower for the assembly including the current control circuit 20 in comparison to the fault current waveforms through the switching elements 66,68,70 of the first module 60 for the assembly omitting the current control circuit 22. Accordingly it is shown that the current control circuit 22 is able to limit the fault current waveforms in the converter 22 during an internal converter fault.

In view of the foregoing, the configuration of the current control circuit 20 of the invention enables the current control circuit 20 to be provided with soft-start, fault current blocking and fault current limiting capabilities in order to provide the switched capacitor DC-DC converter 22 with protection from potentially damaging inrush and fault currents.

The figures are not necessarily to scale, and certain features and certain views of the figures may be shown exaggerated in scale or in schematic form in the interests of clarity and conciseness.

The above embodiment of the invention is used primarily in HVDC applications, but it will be appreciated that the above embodiment of the invention is applicable mutatis mutandis to other applications operating at different voltage levels.

The above embodiment of the invention is described with reference to a switched capacitor DC-DC converter 22, but it will be appreciated that the above embodiment of the invention is applicable mutatis mutandis to other types of converters. In addition, it will be appreciated that the topology of the switched capacitor DC-DC converter of the following embodiment of the invention is merely chosen to help illustrate the working of the invention, and may be replaced by another switched capacitor converter with a different topology.

The invention claimed is:

1. A current control circuit for connection between a first electrical network and a converter, the converter including at least one energy storage device, the current control circuit comprising:
   first and second input terminals for connection to the first electrical network;
   first and second output terminals for respective connection to converter terminals of the converter;
   first and second switching limbs, the first switching limb interconnecting the first input and output terminals, the second switching limb interconnecting the second input and output terminals, each switching limb including a respective switching element;
   a director limb extending between the first and second output terminals, the director limb including at least one current director element and at least one first resistive element, the director limb including an intermediate terminal;
   a second resistive element, a first end of the second resistive element operably connected to the intermediate terminal, a second end of the second resistive element operably connectable to ground; and
   a controller programmed to selectively control switching of each switching element so as to, in use, regulate a flow of current from the first electrical network to the converter.

2. The current control circuit according to claim 1 wherein the controller is programmed to selectively control switching of each switching element during a start-up of the converter so as to, in use, regulate the flow of current from the first electrical network to the converter by directing the current through one or more of the resistive elements.

3. The current control circuit according to claim 1 wherein the controller is programmed to selectively control switching of each switching element so as to, in use, limit or block a flow of current from the first electrical network to the converter.

4. The current control circuit according to claim 1 wherein the controller is programmed to selectively control switching of each switching element so as to, in use, disconnect the converter from the first electrical network in response to an occurrence of a fault in the converter and/or in the first electrical network.

5. The current control circuit according to claim 1 wherein the director limb includes first and second director limb portions, the first and second director limb portions separated by the intermediate terminal, the first director limb portion extending between the first output terminal and the intermediate terminal, the second director limb portion extending between the second output terminal and the intermediate terminal, each director limb portion including a respective current director element and a respective first resistive element.

6. The current control circuit according to claim 1 wherein the or each current director element is configured to permit current to flow in the director limb in one direction and block current from flowing in the director limb in the opposite direction.

7. The current control circuit according to claim 1 including:
   a third switching limb, a first end of the third switching limb operably connected to the first input terminal, a second end of the third switching limb for connection to the first electrical network; and
   a fourth switching limb, a first end of the fourth switching limb operably connected to the second input terminal, a second end of the fourth switching limb for connection to the first electrical network.

8. A method of operating a current control circuit according to claim 1, the current control circuit being connected between the first electrical network and the converter with the first and second input terminals for connection to the first electrical network and the first and second output terminals respectively connected to converter terminals of the converter, the converter including at least one energy storage device, wherein the method comprises:
   selectively controlling switching of each switching element so as to regulate a flow of current from the first electrical network to the converter.

9. An assembly comprising:
   a converter including first converter terminals and at least one energy storage device; and
   a current control circuit comprising:
     first and second input terminals for connection to the first electrical network;
     first and second output terminals for respective connection to converter terminals of the converter;
     first and second switching limbs, the first switching limb interconnecting the first input and output terminals, the second switching limb interconnecting the second input and output terminals, each switching limb including a respective switching element;
     a director limb extending between the first and second output terminals, the director limb including at least one current director element and at least one first resistive element, the director limb including an intermediate terminal;
     a second resistive element, a first end of the second resistive element operably connected to the intermediate terminal, a second end of the second resistive element operably connectable to ground; and
     a controller programmed to selectively control switching of each switching element so as to, in use, regulate a flow of current from the first electrical network to the converter,
   wherein the first and second output terminals are respectively connected to the first converter terminals.

10. The assembly according to claim 9 including at least one first filter energy storage device connected between the first input terminal and the first end of the second resistive element, and/or at least one first filter energy storage device connected between the second input terminal and the first end of the second resistive element.

11. The assembly according to claim 9 wherein the converter includes at least one module, the or each module including at least one switching element and at least one energy storage device), the or each switching element and the or each energy storage device in the or each module arranged to be combinable to selectively provide a voltage source, and/or wherein the converter includes a plurality of energy storage devices and a plurality of switching elements arranged to define a switched energy storage device converter.

12. The assembly according to claim 9 wherein the controller is programmed to selectively control switching of each switching element during a start-up of the converter so as to, in use, regulate charging of the or each energy storage device by regulating the flow of current from the first electrical network to the converter.

13. The assembly according to claim 9 wherein the controller is programmed to selectively control switching of each switching element during a start-up of the converter so as to, in use, connect the first electrical network to the converter via the first switching limb to charge the energy storage device, or at least one of the energy storage devices, of the converter, and then connect the first electrical network to the converter via the second switching limb to charge the energy storage device, or at least one of the energy storage devices, of the converter.

14. The assembly according to claim 9, the converter including second converter terminals for connection to a second electrical network, the assembly including at least one second filter energy storage device connected to the second converter terminals, wherein the controller is programmed to selectively control switching of each switching element during a start-up of the converter so as to, in use, use energy stored in the energy storage device, or at least one of the energy storage devices, to charge the or each second filter energy storage device.

\* \* \* \* \*